(12) United States Patent
Matsuoka

(10) Patent No.: US 7,135,086 B2
(45) Date of Patent: *Nov. 14, 2006

(54) METHOD FOR MANUFACTURING DISPLAY PANEL

(75) Inventor: Hideki Matsuoka, Gifu (JP)

(73) Assignee: Sanyo Electric Co., Ltd. (JP)

(*) Notice: Subject to any disclaimer, the term of this patent is extended or adjusted under 35 U.S.C. 154(b) by 129 days.

This patent is subject to a terminal disclaimer.

(21) Appl. No.: 10/183,785

(22) Filed: Jun. 27, 2002

(65) Prior Publication Data

US 2003/0006003 A1    Jan. 9, 2003

(30) Foreign Application Priority Data

Jun. 29, 2001  (JP)  ............................. 2001-198925

(51) Int. Cl.
*B32B 37/00* (2006.01)
*G02F 1/13* (2006.01)

(52) U.S. Cl. ................ 156/272.2; 156/106; 156/272.5; 156/275.7; 156/312; 156/99; 349/187; 349/190; 445/25; 445/44

(58) Field of Classification Search ................ 156/99, 156/106, 272.2, 275.5, 275.7, 312, 350; 349/187, 349/190; 445/25, 44
See application file for complete search history.

(56) References Cited

U.S. PATENT DOCUMENTS

| | | | |
|---|---|---|---|
| 4,640,583 A | 2/1987 | Hoshikawa et al. | |
| 5,085,605 A | 2/1992 | Itani et al. | |
| 5,239,228 A | 8/1993 | Taniguchi et al. | |
| 5,246,789 A | 9/1993 | Itani et al. | |
| 5,426,522 A | 6/1995 | Takahara et al. | |
| 5,568,297 A | 10/1996 | Tsubota et al. | |
| 5,632,663 A | 5/1997 | Ishihara et al. | |
| 5,717,476 A | 2/1998 | Kanezawa | |
| 5,788,551 A | 8/1998 | Dynka et al. | |
| 5,909,266 A * | 6/1999 | Matsuo et al. | 349/187 |
| 5,959,712 A | 9/1999 | Morii et al. | |
| 6,191,841 B1 | 2/2001 | Ootaguro et al. | |
| 6,222,603 B1 * | 4/2001 | Sakai et al. | 349/153 |
| 6,268,071 B1 | 7/2001 | Yasukawa et al. | |
| 6,284,342 B1 | 9/2001 | Ebisawa et al. | |
| 6,612,888 B1 | 9/2003 | Pai et al. | |
| 6,624,570 B1 | 9/2003 | Nishio et al. | |
| 6,848,963 B1 | 2/2005 | Lee et al. | |
| 2002/0000560 A1* | 1/2002 | Ishii et al. | 257/81 |
| 2003/0011737 A1* | 1/2003 | Matsuoka | 349/153 |

FOREIGN PATENT DOCUMENTS

| | | |
|---|---|---|
| EP | 0 415 372 | 3/1991 |
| EP | 0 969 700 | 1/2000 |
| JP | 04199129 A * | 7/1992 |
| JP | 6-102498 | 4/1994 |
| JP | 7-64101 | 3/1995 |

(Continued)

OTHER PUBLICATIONS

Office Action for U.S. Appl. No. 10/183,252, filed Sep. 17, 2004.

(Continued)

*Primary Examiner*—Justin Fischer
(74) *Attorney, Agent, or Firm*—Cantor Colburn LLP

(57) ABSTRACT

A glass substrate of a display panel onto which an organic electroluminescence (EL) element or the like is formed is sealed by affixing the glass substrate and a sealing glass via an adhesive therebetween. During this process, a pressure is applied between the glass substrate and the sealing glass so that a gap between the affixing surfaces achieves a target value and the adhesive is cured. The pressure is changed over time based on conditions such as the viscosity of the adhesive so that quick and precise sealing by the adhesive can be achieved.

34 Claims, 12 Drawing Sheets

FOREIGN PATENT DOCUMENTS

| | | |
|---|---|---|
| JP | 11-224773 | 8/1999 |
| JP | 2000-3783 | 1/2000 |
| JP | 2000047229 A * | 2/2000 |
| JP | 2000-173766 | 6/2000 |
| JP | 2001-35654 | 2/2001 |
| JP | 2001-102167 | 4/2001 |
| JP | 2001-155855 | 6/2001 |
| KR | 1991-0005078 | 3/1991 |
| KR | 2001-0050684 | 6/2001 |

OTHER PUBLICATIONS

Office Action for Chinese Application No. 02125167.3 dated Jun. 25, 2004.

Office Action for Korean Patent Application No. 10-2002-0036798 dated Mar. 2, 2004.

Office Action for Korean Patent Application No. 10-2002-0036901 dated Jul. 22, 2004.

Office Action for Korean Patent Application No. 10-2002-0037534 dated Jul. 26, 2004.

A copy of the excerpt English translation of the Japanese Patent Laid-Open Publication No. Hei 11-224773.

A copy of the excerpt English translation of the Japanese Patent Laid-Open Publication No. Hei 2001-155855.

Office Action for U.S. Appl. No. 10/183,252, dated Jan. 5, 2004.

* cited by examiner

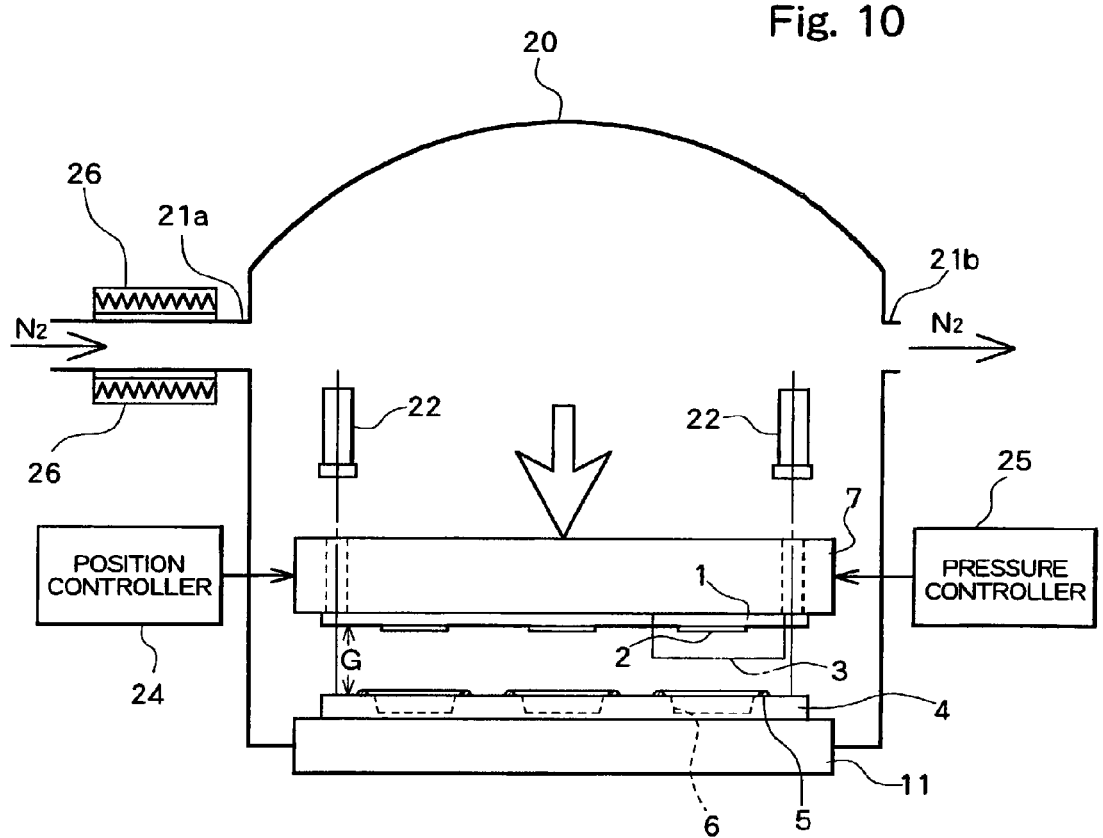
Fig. 10
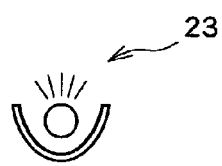

METHOD FOR MANUFACTURING DISPLAY PANEL

BACKGROUND OF THE INVENTION

1. Field of the Invention

The present invention relates to a method for manufacturing a display panel used in a display device for displaying text, images, etc.

2. Description of the Related Art

In general, display panels used in electroluminescence (EL) display devices and in liquid crystal display devices are constructed to include display substrates onto which display elements such as, for example, a light emitting element, liquid crystal, and a driving element for driving the light emitting element or liquid crystal are provided. Normally, in order to maintain the function and quality of the display substrate, the display substrate is sealed with a suitable sealing member. Examples of materials used for such a sealing member include metal and glass. The display substrate is affixed to the sealing member by an adhesive and sealed. The quality of sealing of the display substrate in the display panel is an important factor for determining the quality and lifetime of the display device.

FIG. 1 schematically shows how a display substrate is sealed by a sealing member.

As shown in FIGS. 1(a) and 1(b), element layers 32 which will become the display regions are formed through a thin film formation process on one side of a glass substrate 31 which is a type of display substrate 33. FIGS. 1(a) and 1(b) show an example configuration in which a plurality of (twelve) element layers 32 and a plurality of (twelve) display substrates 33 are simultaneously formed on a glass substrate 31 for simultaneously manufacturing a plurality of (twelve) display panels. The position of the glass substrate 31 relative to a sealing glass 34 which is the sealing member placed to oppose the element layers 32 is determined by an image processor or the like which recognizes one or more positioning marks 39 on the sealing glass 34. Then, the glass substrate 31 is moved in the Z direction shown in FIG. 1(a) and is affixed to the sealing glass 34. On the sealing glass 34, an adhesive 35 is applied in advance in a manner to surround the display regions along the shape to be sealed of the display substrates 33 (more specifically, their element layers 32). The surface of the sealing glass 34 opposing the display substrate 33 is engraved through etching or the like to correspond to the shapes and arrangement of the element layers 32. The engraved section 36 of the sealing glass 34 is provided for applying an absorbent or the like for maintaining the characteristics of the display substrate 33 to be sealed. In FIG. 1(b), the glass substrate 31 is not shown.

FIG. 2 schematically shows the cross section of the structure when the glass substrate 31 and the sealing glass 34 are affixed. The glass substrate 31 is held to a supporting member 37 using vacuum suction and affixed to the sealing glass 34 which is placed on a base (not shown). During this process, as shown in FIG. 2, the glass substrate 31 and the sealing glass 34 are pressed towards each other so that a predetermined gap G is formed between the glass substrate 31 and the sealing glass 34. After the gap G is adjusted to the predetermined value, a curing process for the adhesive 35 is applied and the display substrate 33 is sealed by the sealing glass 34. During this sealing process, the width of the portion of the glass substrate 31 and of the sealing glass 34 in contact with the adhesive 35, that is, the seal line width W, is determined by the amount and viscosity of the adhesive 35, the gap G, the magnitude and duration of the applied pressure, etc. Also, a spacer 38 having a cylindrical or a spherical shape with a predetermined diameter, for example, is provided within the adhesive 35 (schematically shown in FIG. 2) so that a predetermined gap G can be obtained using the spacer 38 as a stopper for the pressure application.

Normally, a resinous adhesive is used as the adhesive 35. When a resinous adhesive is used, the material of the resin is selected based on the type of display substrate 33, the object of sealing, etc. However, for some of these resins, the viscosity cannot be adjusted.

For example, for a display substrate used in a display panel of an EL display device, that is, a display substrate 33 onto which an EL element is formed at the element layer 32, because an EL element has characteristics that its heat endurance is low and an EL element is easily degraded by moisture, an ultraviolet curable epoxy resin which has low permeability for water and, in addition, which does not require heating for curing is used as the adhesive 35. Because the ultraviolet curable epoxy resin is not diluted by any solvent, in general, the ultraviolet curable epoxy resin has a high viscosity and cannot be adjusted to a viscosity at which the resin can be easily used. In addition, if the viscosity is adjustedby changing the constitution of the ultraviolet curable epoxy resin, it is difficult to maintain the low water permeability characteristic of the resin.

When a resin having a high viscosity as described above is used as the adhesive 35, it is necessary, during the affixing of the glass substrate 31 to the sealing glass 34 as described above, to apply a higher pressure on the affixing surfaces of the substrate 31 and the sealing glass 34 to allow the gap G to reach a desired value and, at the same time, secure the seal line width W. However, if the magnitude of the applied pressure is rapidly increased, the adhesive 35 having a high viscosity cannot change its shape to respond to the change in the pressure, and affixing defects such as shown by dotted lines in FIG. 3 which is a plan view of the sealing glass 34 may be generated.

More specifically, when the adhesive 35 does not follow the change in the applied pressure and the gap G does not uniformly reach a desired value, defects such as (A) creation of a seal path through which the gas remaining in the inner space to be sealed can escape, (B) instability of the seal line width W, and (C) deviation of the adhesive 35 from the predetermined sealing position, may be generated. These are marked with the respective labels A, B, and C in FIG. 3. These affixing defects not only cause shape defects, but may also adversely affect the quality and lifetime of the EL display device by, for example, creating a sealing defect, causing the pressurized gas to remain inside, or increasing water permeability.

In addition to affecting the above described display substrate onto which an EL element is formed, the above-described disadvantages are common when sealing any display panel, such as, for example, a liquid crystal display substrate and a plasma display substrate, when the display substrate is sealed using a suitable sealing member and a highly viscous resin adhesive.

SUMMARY OF THE INVENTION

The present invention was conceived to solve the above described problems and one object of the present invention is to quickly and precisely seal a display substrate using a sealing member and an adhesive, even when a highly viscous adhesive is employed.

In order to achieve at least this object, according to one aspect of the present invention, there is provided a method for manufacturing a display panel in which an element substrate and a sealing substrate are affixed with an adhesive in between the element substrate and the sealing substrate, wherein a display element is formed on the element substrate, the sealing substrate is placed to oppose the element substrate at the side onto which the display element is formed, and the adhesive is provided at positions to surround the formation region of the element, and the adhesive is cured, and wherein pressure for pressing the substrates after the affixing is changed, altered, or adjusted over time.

According to another aspect of the present invention, it is preferable that, in the method for manufacturing, the pressure is changed in stages. According to yet another aspect of the present invention, it is preferable that, in the method for manufacturing, the pressure is increased in stages. According to another aspect of the present invention, it is preferable that, in the method for manufacturing, the pressure is changed over time until the gap between the element substrate and the sealing substrate to be affixed with the adhesive therebetween reaches a target value.

In this manner, by changing the applied pressure over time, it is possible to easily secure sufficient time to allow gas present in the region between the sealing substrate and the display substrate to be discharged from the inter-substrate gap, according to the setting. Also, by changing the applied pressure, it is possible to allow gradual deformation, by the pressing, of the adhesive placed between the element substrate and the sealing substrate. Even when an adhesive having a high viscosity is employed, it is easy to control the deformation of the adhesive to be uniform at every point, and it is possible to obtain uniform gap between the substrates and uniform abutting region (seal width) of the adhesive with respect to the affixing surfaces of the sealing substrate and the element substrate.

Moreover, by controlling the change over time of the applied pressure in stages as described above, by increasing the applied pressure in stages, or by changing the applied pressure by monitoring the gap width, it is possible to easily enable precise sealing in a short time.

According to another aspect of the present invention, it is preferable that, in the method for manufacturing, the pressure is changed over time by repeating a pressure changing period in which the pressure is changed and a pressure retaining period in which a constant pressure is retained.

According to another aspect of the present invention, it is preferable that, in the method for manufacturing, the constant pressure retained in each of the pressure retaining periods is the final pressure of a pressure changing period immediately before the pressure retaining period.

According to another aspect of the present invention, it is preferable that, in the method for manufacturing a display panel, a plurality of the pressure changing periods and a plurality of the pressure retaining periods are repeated, and the duration of each of the plurality of pressure retaining periods is independently set at an arbitrary length.

According to another aspect of the present invention, it is preferable that, in the method for manufacturing a display panel, a plurality of the pressure changing periods and a plurality of the pressure retaining periods are repeated, and the amount of change in pressure for each of the plurality of pressure changing periods is independently set at an arbitrary value.

According to another aspect of the present invention, it is preferable that, in the method for manufacturing a display panel, the pressure is changed over time through 3 repetitions of pressure changing periods in which pressure is changed and pressure retaining periods in which a constant pressure is retained.

By changing the applied pressure and repeating the pressure changing period and the pressure retaining period as described above, it is possible to set the conditions for each period with a high degree of freedom in consideration of the characteristics of the adhesive or the like, thereby allowing for smooth and uniform deformation of the adhesive provided between the substrates that follows the applied pressure for pressing the substrates. Therefore, it is possible to allow quick sealing of an element substrate by a sealing substrate while maintaining a high reliability.

Because precise and quick sealing is possible using a simple control method of repeating pressure changing periods and pressure retaining periods of arbitrary conditions, the present invention is highly advantageous in terms of reducing manufacturing costs.

According to another aspect of the present invention, it is preferable that, in the method for manufacturing a display panel, the amount of change in pressure for a later pressure changing period among the plurality of pressure changing periods is smaller than the amount of change in pressure for an earlier pressure changing period.

For example, for an adhesive having a high viscosity, as the magnitude of the applied pressure is increased, the deformation rate following the applied pressure decreases. Because of this, by decreasing the amount of change in pressure at a later period among the plurality of pressure changing periods, it is possible to uniformly deform the adhesive to reliably follow the applied pressure even for an adhesive having such characteristics. Also, the deformation rate of the adhesive, that is, the gap between the substrates can be controlled with high precision with respect to a target gap between the substrates, allowing for further improvement of sealing quality.

According to another aspect of the present invention, it is preferable that, in the method for manufacturing a display panel, the rate of change of pressure in at least one of the plurality of pressure changing periods differs from the rate of change of pressure in the other periods. In this manner, by allowing the rate of change to be variable among the pressure changing periods, it is possible to uniformly and quickly deform the adhesive by pressing the substrates under optimal conditions based on the characteristics of the employed adhesive, thereby improving the sealing quality.

According to another aspect of the present invention, it is preferable that, in the method for manufacturing, the adhesive is an ultraviolet curable resin. According to another aspect of the present invention, it is preferable that, in the method for manufacturing, the ultraviolet curable resin is a cation polymerization type epoxy resin.

By employing an ultraviolet curable resin, it is possible to perform the sealing process without actively applying heat which tends to adversely affect the element.

Moreover, because the adhesive is cured through cation polymerization by irradiation of ultraviolet light, it is possible to seal the display substrate without heating and without generating moisture. Because of this, even when the display substrate is constructed to have a display element having low thermal endurance or a display element having characteristics that degradation is accelerated by moisture, it is possible to preferably seal the display substrate without degradation.

According to another aspect of the present invention, it is preferable that, in the method for manufacturing, the temperature of the adhesive is controlled during when the element substrate and the sealing substrate are affixed with the adhesive therebetween.

According to another aspect of the present invention, it is preferable that, in the method for manufacturing, prior to pressing the element substrate and the sealing substrate to be affixed, the temperature of the adhesive is raised to a predetermined temperature.

According to another aspect of the present invention, it is preferable that, in the method for manufacturing, the element substrate and the sealing substrate are pressed by a pressure which changes over time while the temperature of the adhesive is being raised to a predetermined temperature.

According to another aspect of the present invention, it is preferable that, in the method for manufacturing, the temperature of the adhesive is controlled based on the pressure for pressing the substrates after the affixing.

As described, various forms of temperature control can be performed by selecting various conditions such as the characteristics of the adhesive and the applied pressure and, thus, it is possible to quickly and precisely deform the adhesive and to improve the quality of sealing of the element substrate by a sealing substrate.

According to another aspect of the present invention, it is preferable that, in the method for manufacturing, the temperature of the adhesive to be controlled is a temperature that does not cause or lead to degradation of the characteristics of the display element.

According to another aspect of the present invention, it is preferable that, in the method for manufacturing, the display element is an electroluminescence display element.

According to another aspect of the present invention, it is preferable that, in the method for manufacturing, the electroluminescence display element is an organic electroluminescence element containing an organic compound at least in an emissive layer.

In this manner, by controlling the temperature of the adhesive in consideration of the degradation in, for example, the characteristics of the electroluminescence display element caused by heat, it is possible to reliably seal an element substrate even when, for example, an organic electroluminescence display element which is easily degraded by heat is formed on the element substrate.

BRIEF DESCRIPTION OF THE DRAWINGS

FIG. 10 is a diagram showing an example structure of a device for practicing a second embodiment of a method for manufacturing a display panel according to the present invention.

DESCRIPTION OF PREFERRED EMBODIMENTS (First Embodiment)

Figure 1:
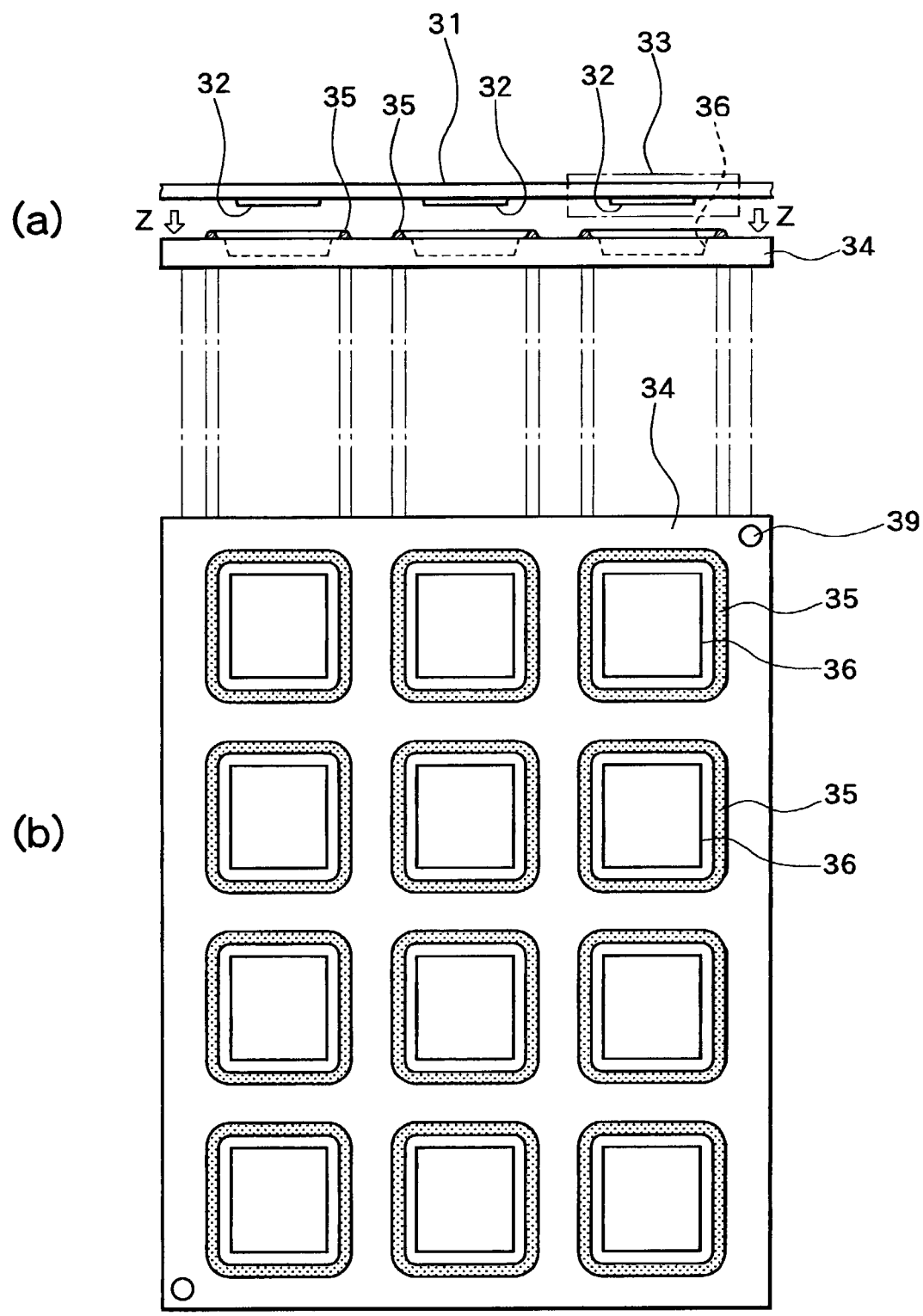
FIG. 1 is a diagram showing sealing between a glass substrate which includes a plurality of display substrate regions and a sealing substrate in a method for manufacturing a display panel according to a related art.
Figure 2:
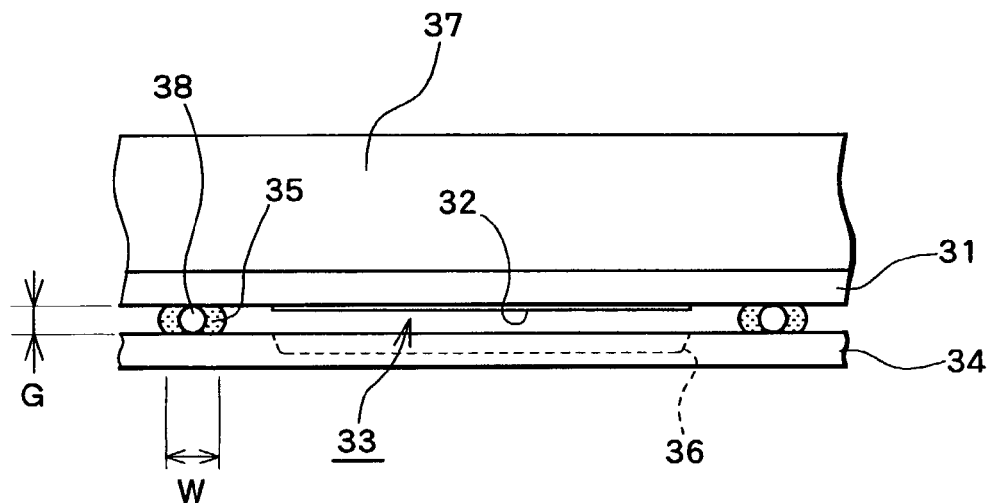
FIG. 2 is a diagram schematically showing the cross section when the glass substrate and the sealing substrate shown in FIG. 1 are affixed.

A first preferred embodiment of a method for manufacturing a display panel according to the present invention will now be described referring to FIGS. 4–6 using an example in which the method is used for manufacturing a display panel having a display substrate (element substrate) constructed to include an organic EL element as the display element. In the first embodiment, similar to the conventional art exemplified above and shown in FIGS. 1 and 2, for sealing, with a sealing member (in the embodiments, glass; hereinafter referred to as "sealing glass"), the display substrate constructed by forming an element layer on a glass substrate, an adhesive is applied in advance on the affixing surface between the sealing glass and the display substrate in a manner to surround the display regions of the display substrate. After the sealing glass and the display substrate are affixed, a pressure which changes over time is applied to the affixing surface by pressing substrates. Then, after the gap between the sealing glass and the display substrate has reached a target value, the adhesive is cured.

Figure 4:
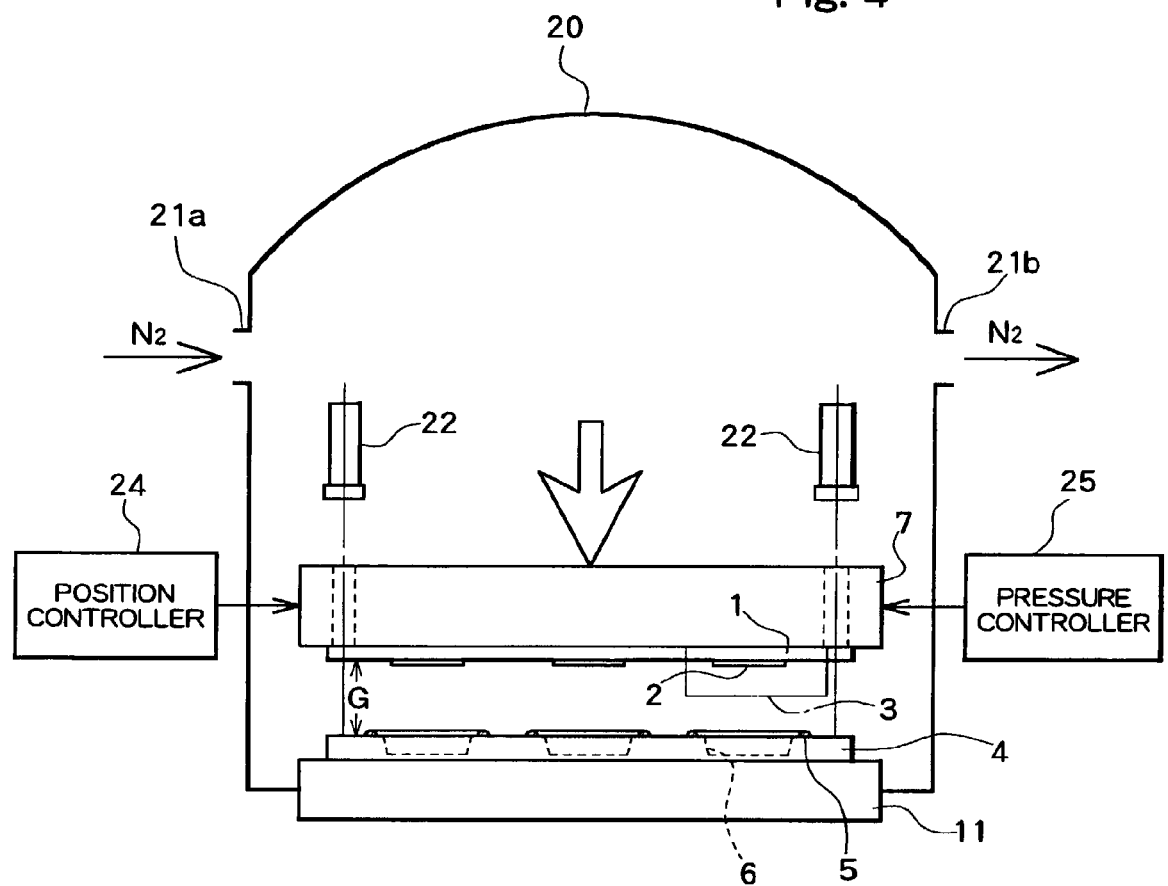
FIG. 4 is a diagram showing an example device structure for practicing a first embodiment of a method for manufacturing a display panel according to the present invention.
Figure 4:
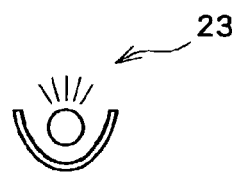

FIG. 4 is a schematic diagram showing an example structure of an apparatus for manufacturing a display panel by the method for manufacturing according to the first embodiment.

As shown in FIG. 4, on one surface of glass substrates 1 which are a type of a display substrate 3, element layers 2 constructed from an organic EL element or the like are formed through a thin film formation process. Again, in this structure, similar to FIG. 1, for example, a plurality of element layers 2 are simultaneously formed on a glass substrate 1 (mother substrate) and a plurality of display substrates 3 are simultaneously created so that a plurality of display panels are manufactured simultaneously. The glass substrate 1 is affixed (adhered) to a sealing glass 4, which is a sealing member placed to oppose the element layers 2. On the sealing glass 4, an adhesive 5 is applied in a manner to surround the display substrate 3, that is, along the shape for sealing the element layers 2. The adhesive 5 is made of an ultraviolet curable resin having a high viscosity, for example, a cation polymerizing, ultraviolet curable epoxy resin. The epoxy resin is well suited for an application to seal the organic EL element or the like because the resin has characteristics of low contraction ratio during curing process and low permeability for water. In addition, the surface of the sealing glass 4 which opposes the display substrate 3 is engraved through etching or the like to correspond to the shape and arrangement of the display substrates 3 (more specifically, their element layers 2). The engraved section 6 of the sealing glass 4 is provided for applying an absorbent or the like for maintaining the characteristics of the display substrate 3 to be sealed.

Each of the above described members is placed in a chamber 20. The inside of the chamber 20 is filled with nitrogen gas ($N_2$) which is supplied to and discharged from the chamber 20 through a respective gas introduction port 21a and gas discharging port 21b. In order to prevent degradation of the organic EL element by the moisture present in the atmosphere, nitrogen gas having a moisture content of 5 ppm or less is used.

In the chamber 20, the glass substrate 1 is vacuum suctioned to a supporting member 7 provided within the chamber 20. The position of and the pressure applied to the supporting member 7 are controlled. In FIG. 4, the apparatus (mechanism) for vacuum suctioning the glass substrate 1 is not shown. On the other hand, the sealing glass 4 is placed on a quartz glass 11 which is installed at the bottom surface of the chamber 20. An apparatus 24 for controlling the position of the supporting member 7 moves the supporting member 7 and the glass substrate 1 in the horizontal direction based on an image of, for example, one or more positioning marks (not shown) which are imaged by one or more CCD cameras 22 provided within the chamber 20, and determines the relative position of the supporting member 7 and the glass substrate 1 with respect to the sealing glass 4. After the positioning process is completed, an apparatus for controlling the pressure applied to the supporting member 7 applies a pressure to the supporting member 7 and the glass substrate 1 in the direction shown by the arrow towards the sealing glass 4 so that pressure is applied at the affixing surfaces between the glass substrate 1 and the sealing glass 4. The pressure controller 25 also includes a function to monitor the applied pressure during the pressure application, and, therefore, it is possible to arbitrarily control the applied pressure while monitoring the pressure. In the manufacturing apparatus shown in FIG. 4, the reference numeral 23 denotes an ultraviolet light source for irradiating ultraviolet radiation through the quartz glass 11 and the sealing glass 4 onto the adhesive 5 composed of the cation polymerizing, ultraviolet curable epoxy resin, for curing the adhesive 5.

A method of manufacturing according to the first embodiment will now be described in detail using an example for manufacturing a display panel of an EL display device using the manufacturing apparatus shown in FIG. 4.

Figure 5:
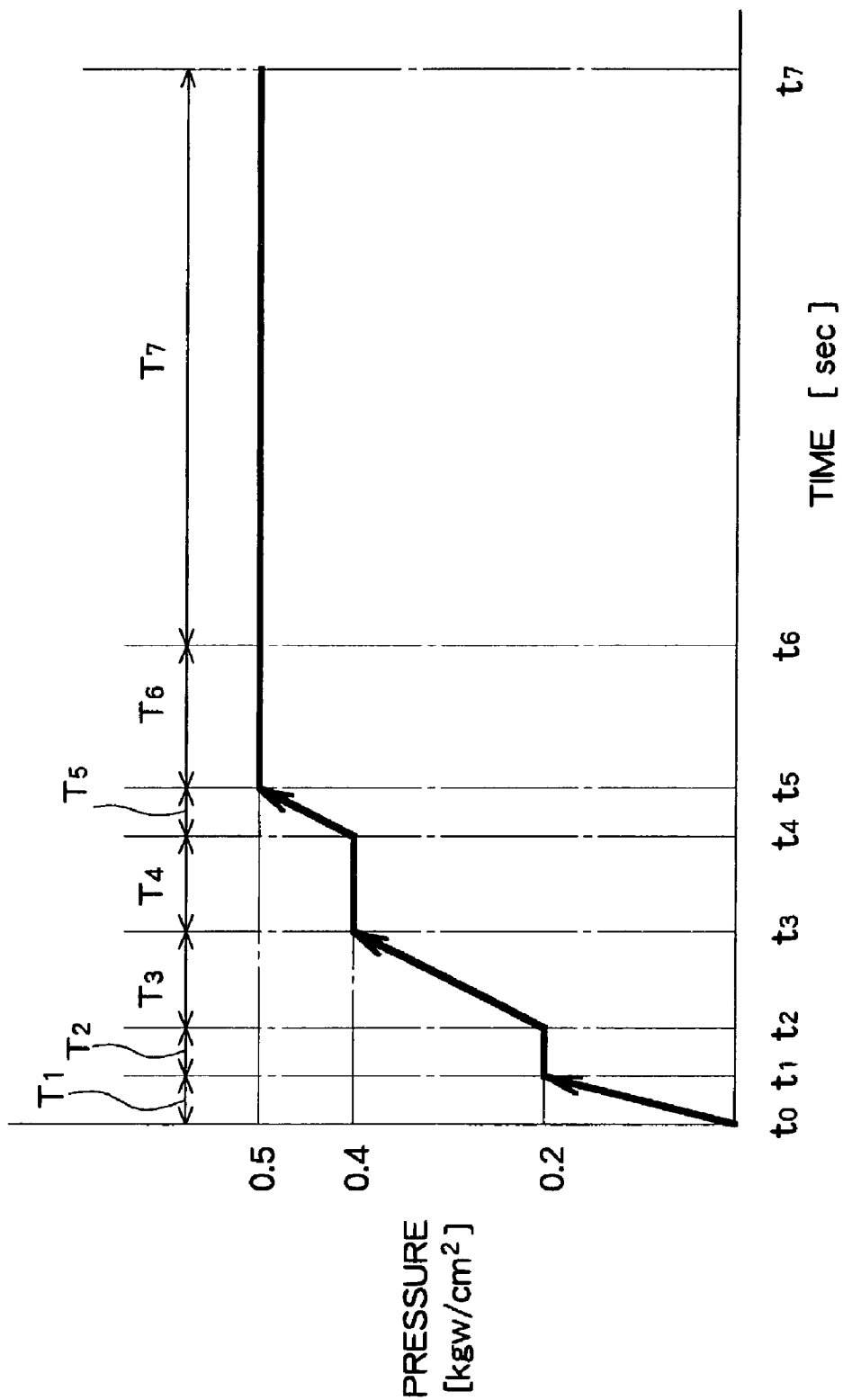
FIG. 5 is a time chart showing an example application pattern of pressure for pressing the display substrate and the sealing substrate in the first embodiment of a method for manufacturing a display panel according to the present invention.

FIG. 5 is a time chart showing an example pattern of pressure application by the pressure controller 25 for the supporting member 7.

In this first embodiment, the relative position between the glass substrate 1 and the sealing glass 4 is determined using the position controller 24 for the supporting member 7, and then the glass substrate 1 and the sealing glass 4 are pressed towards each other to thereby apply a pressure to the affixing surface between the glass substrate 1 and the sealing glass 4 according to the pressure application pattern shown in FIG. 5.

In this pressure application pattern, pressure is applied according to the following three conditions, (i), (ii), and (iii).

(i) Pressure changing periods (periods $T_1$, $T_3$, and $T_5$ in FIG. 5) in which the pressure is changed (increased) at a constant rate and pressure retaining periods (periods $T_2$, $T_4$, and $T_6$ in FIG. 5) in which the changed (increased) pressure is retained at a constant pressure are repeated so that the pressure and gap reach their respective target values.

(ii) The pressure retaining periods $T_2$, $T_4$, and $T_6$ are set so that the length of the later period is longer. That is, the lengths of periods $T_2$, $T_4$, and $T_6$ satisfy the following relationship.

$$T_2 < T_4 < T_6$$

(iii) The amount of change (amount of increase) $\delta P5$ of the pressure at the final pressure changing period $T_5$ is set to be smaller than the respective amounts of change (amounts of increase) $\delta P1$ and $\delta P3$ of pressure at the previous pressure changing periods, $T_1$ and $T_3$. In other words, the amounts of change $\delta P1$, $\delta P3$, and $\delta P5$ satisfy the following relationships. In the example process shown in FIG. 5, $\delta P1$ and $\delta P3$ are equal to 0.2 kgw/cm$^2$ and $\delta P5$ is equal to 0.1 kgw/cm$^2$.

$$\delta P1 > \delta P5$$

$$\delta P3 > \delta P5$$

In this manner, by applying a pressure of a predetermined pattern to the affixing surface between the glass substrate 1 and the sealing glass 4, the gap G reaches its target value at least at the pressure retaining period $T_6$, with the spacer (denoted by reference numeral 38 in FIG. 2) provided within the adhesive 5 acting as a stopper. The value of the gap G at this point is approximately 5 μm. In order to inhibit the penetration of moisture at the sealing section, it is preferable that the gap G be set at 5 μm±1 μm, and, more preferably, 5 μm±0.3 μm. At the subsequent period, $T_7$, while the pressure is continued to be applied, the ultraviolet light source 23 is switched on at time $t_6$ to start the irradiating of ultraviolet light onto the affixing surface through an infrared cut filter (not shown). The ultraviolet irradiation is continued for the duration of the period $T_7$, that is, until time $t_7$.

When the cross sectional shape of the adhesive 5 applied on the substrate is semicircular with a diameter of approximately 300 μm, the size of the glass substrate 1 is 300 mm×400 mm, and it is desired to obtain 9–96 display substrates 3 by cutting after the sealing process, the pressures applied to the affixing surface during the pressure retaining periods $T_2$, $T_4$, and $T_6$ respectively are, as shown in FIG. 5, 0.2 kgw/cm$^2$, 0.4 kgw/cm$^2$, and 0.5 kgw/cm$^2$. The durations for each of the periods in the pressure application pattern are, from period $T_1$ to period $T_6$, 5 seconds, 5 seconds, 10 seconds, 10 seconds, 5 seconds, and 15 seconds, respectively. In other words, the lengths of pressure retaining periods $T_2$, $T_4$, and $T_6$ are set at a ratio of 1:2:3. In order to obtain uniform gap G and uniform seal line width W (refer to FIG. 2) at the sealing section by the adhesive 5 to secure the sealing quality, the present inventors have found that it is desirable to set the above values within a range of ±20% for the pressure and a range of ±50% for the duration. The present inventors have also found that, for the ultraviolet irradiation period $T_7$, when the ultraviolet illumination is approximately 100 mW/cm$^2$, it is desirable to set the length of period $T_7$ to 60 seconds in order to obtain satisfactory curing of the adhesive 5.

Although in the above description, the pressure is represented in units of force of kilogram weight per square centimeter, that is, [kgw/cm$^2$] for ease of description, the values for pressure can be converted into units of pascal, [Pa], which is the SI unit of pressure by multiplying by a constant 98066.5. For example, 0.2 kgw/cm$^2$ can be converted into 19.6 kPa, 0.4 kgw/cm$^2$ can be converted into 39.2 kPa, and 0.5 kgw/cm$^2$ can be converted into 49.0 kPa.

As described, in the first embodiment, because pressure is applied between the glass substrate 1 and the sealing glass 4 in different stages and the adhesive 5 is then cured, a more uniform gap G and a more uniform seal line width W can be obtained at the sealing section between the glass substrate 1 and the sealing glass 4 by the adhesive 5.

For reference, the mechanism through which the uniform gap G and uniform seal line width W can be obtained at the sealing section will now be described referring to FIG. 6. FIG. 6 schematically shows the condition at the sealing section in which a pressure is applied to the adhesive 5 by the glass substrate 1 and the sealing glass 4. As shown in FIG. 6, for an adhesive 5 which has an approximately semicircular cross sectional shape immediately after application, initially, the area of the contact between the adhesive and the surface of the glass above the adhesive is small. Consequently, the adhesive 5 can be easily deformed even when a pressure of small magnitude is applied to the glass substrate 1 (refer to period $T_1$ in FIG. 5). As the sealing section is pressed and the gap G is narrowed, however, the area of contact between the adhesive and the surface of the glass above the adhesive becomes larger, requiring a pressure of a larger magnitude (refer to periods $T_3$ and $T_5$ in FIG. 5). On the other hand, the highly viscous, elastic adhesive 5 deforms slowly to respond with a certain delay in time to the applied pressure. To this end, by retaining the increased pressure after the pressure to be applied is increased for a predetermined period of time (refer to periods $T_2$ and $T_4$ in FIG. 5), it is possible to secure time for the adhesive to deform in response to the pressure change. Because the pressure is increased to the next stage after the retaining period, the shape of the adhesive 5 can change smoothly, and, consequently, the gap G and the seal line width W become uniform.

Figure 3:
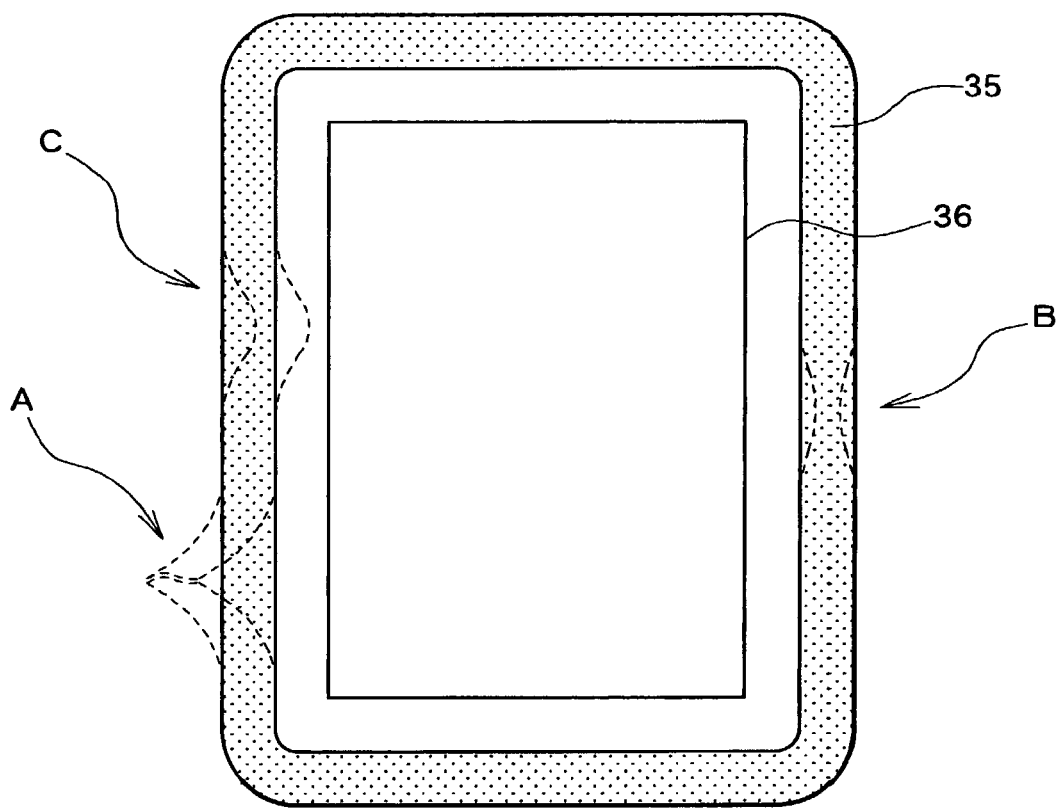
FIG. 3 is a diagram showing examples of sealing defects in the method for manufacturing a display panel in the related art.

Normally, gas is present inside the sealing space. As the gap G is narrowed, the pressure increases and the gas attempts to escape outside. This attempt causes the sealing defect (A) as shown in FIG. 3. With the above method of the first embodiment, however, because it is possible to prevent rapid pressure increase through the pressure retaining periods (periods $T_2$, $T_4$, and $T_6$ in FIG. 5), the generation of sealing defects can be avoided. Therefore, generation of the sealing defect (A) or the like can be desirably avoided.

Figure 6:
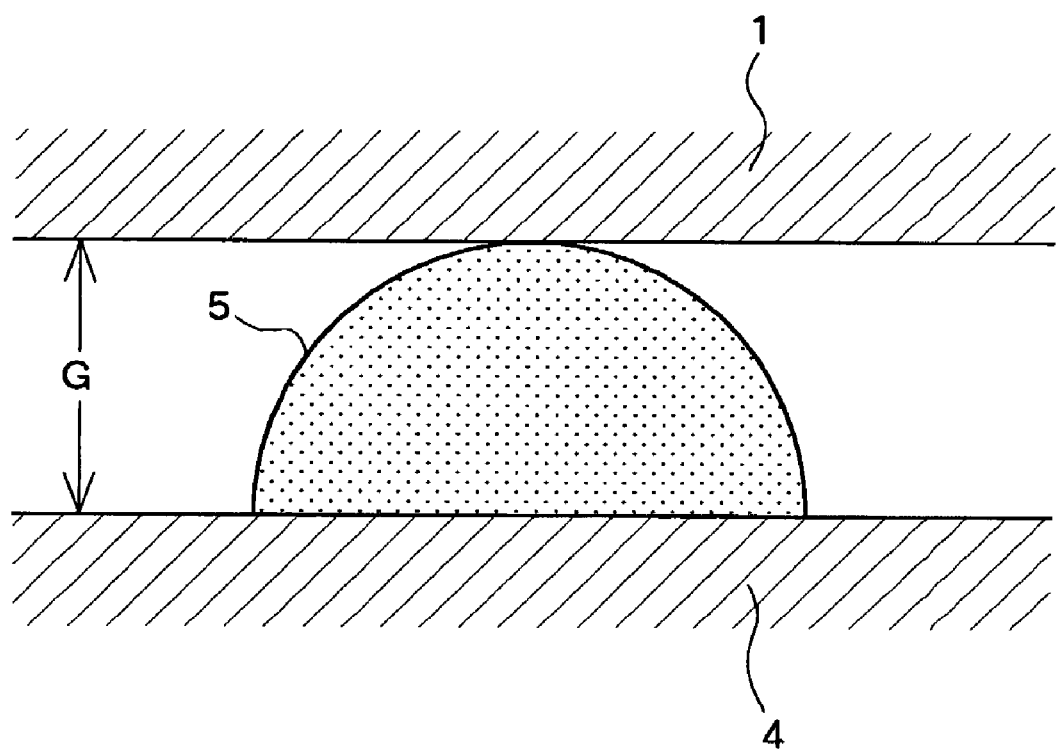
FIG. 6 is a diagram showing deformation of an adhesive placed between substrates.

In FIG. 6, a configuration is shown in which the cross-sectional shape of the adhesive 5 applied to the sealing glass 4 is approximately semi-circular immediately after the application, but, in general, the principle as described above is also applicable to other shapes such as, for example, a circular shape.

In addition, in order to simply secure the sealing quality, it is also possible to omit the pressure retaining period and slowly and continuously increase the pressure to be applied to reach a predetermined pressure. Such a configuration, however, requires a relatively very long time for manufacturing a display panel.

For reference, an example structure of an element layer 2 formed on the display substrate 3 which is used as the organic EL display panel will now be described.

Figure 7:
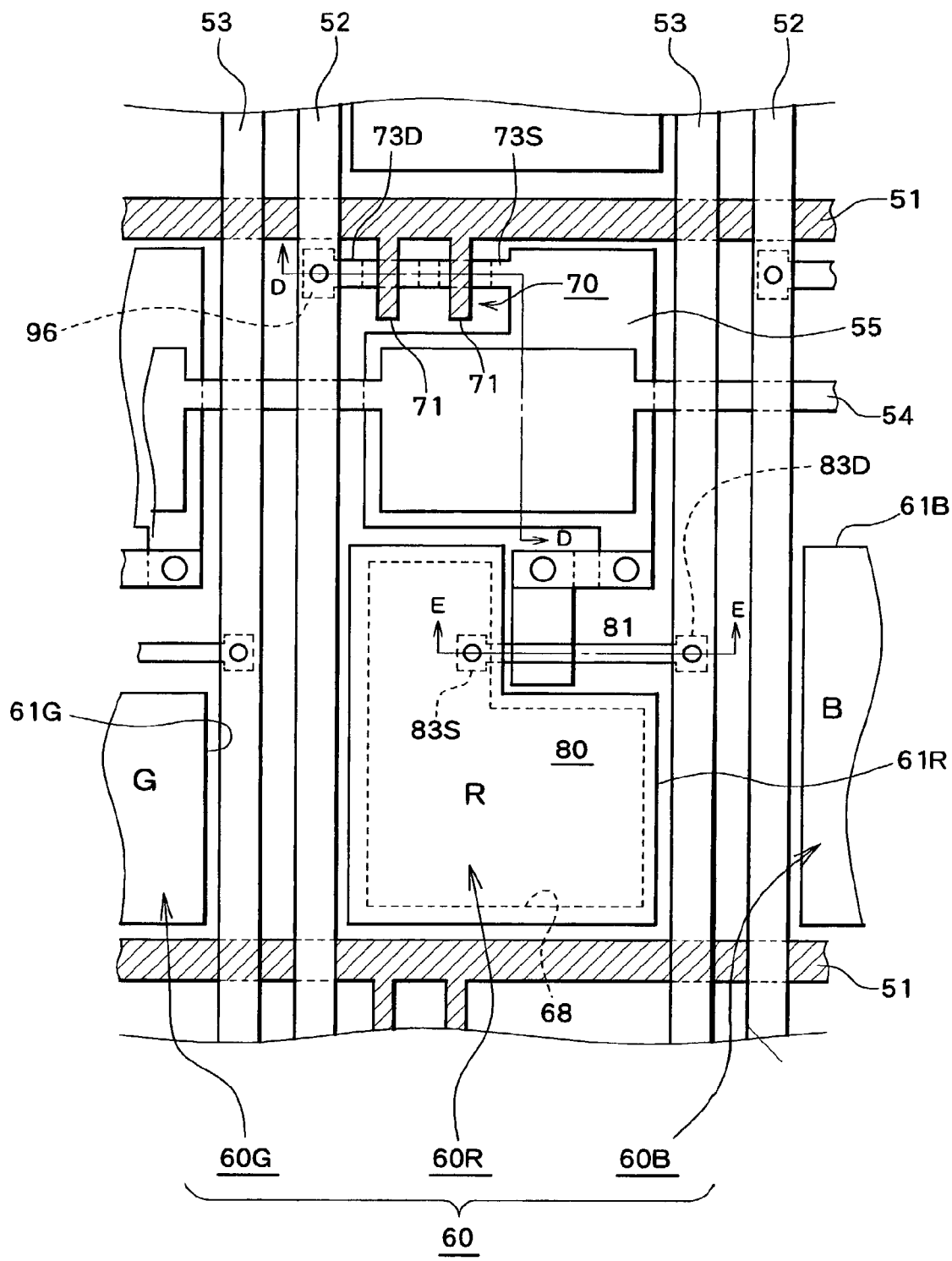
FIG. 7 is a schematic plan view of an organic EL display panel around a pixel of the organic EL display panel related to the embodiments of the present invention.

FIG. 7 is an enlarged plan view of a pixel and its periphery of an active matrix type EL display panel in which a thin film transistor (TFT) which is an active element is added for each EL element forming a display unit (pixel) of the display device.

The EL display panel is a display device which takes advantage of the property of an EL element which emits light when an electric field is applied. On a display substrate, gate signal lines for driving switching TFTs and signal lines for allowing display of each pixel are formed in rows and columns in a matrix form.

As shown in FIG. 7, in the EL display panel, gate signal lines 51 and drain signal lines 52 are formed as the signal lines as described above. Organic EL elements 60 are formed as pixels corresponding to the intersections of these signal lines. In the EL display panel, in order to realize a full-color display, repeating units are formed each consisting of three types of organic EL elements 60R, 60G, and 60B having different emission colors. These three types of EL elements form a group to constitute a display unit as a full-color display device for emitting light of an desired color.

In the vicinity of an intersection between the signal lines, a TFT 70 which is switched by the gate signal line 51 is formed. When the TFT 70 is switched "ON", the signal on the drain signal line (data signal line) 52 is connected to the source 73S and applied to a capacitor electrode 55. The capacitor electrode 55 is connected to a gate 81 of a TFT 80 for driving an EL element. The source 83S of the TFT 80 is connected to an anode 61 of the organic EL element 60 and the drain 83D of the TFT 80 is connected to the driving power supply line 53 which functions as an electric current source for supplying electric current to the organic EL element 60.

Corresponding to the TFTs 70 and 80, a storage capacitor electrode line 51 is formed parallel to the gate signal line 51. The storage capacitor electrode line 54 is formed of, for example, a metal such as chromium (Cr), similar to the gate signal line 51. The storage capacitor electrode line 54 and the capacitor electrode 55 which is placed to oppose the storage capacitor electrode line 54 with an insulative film in between constitute a capacitor element (storage capacitor) in which charges are accumulated. The storage capacitor is provided for maintaining the voltage applied to the gate electrode 81 of the TFT 80.

Figure 8A:
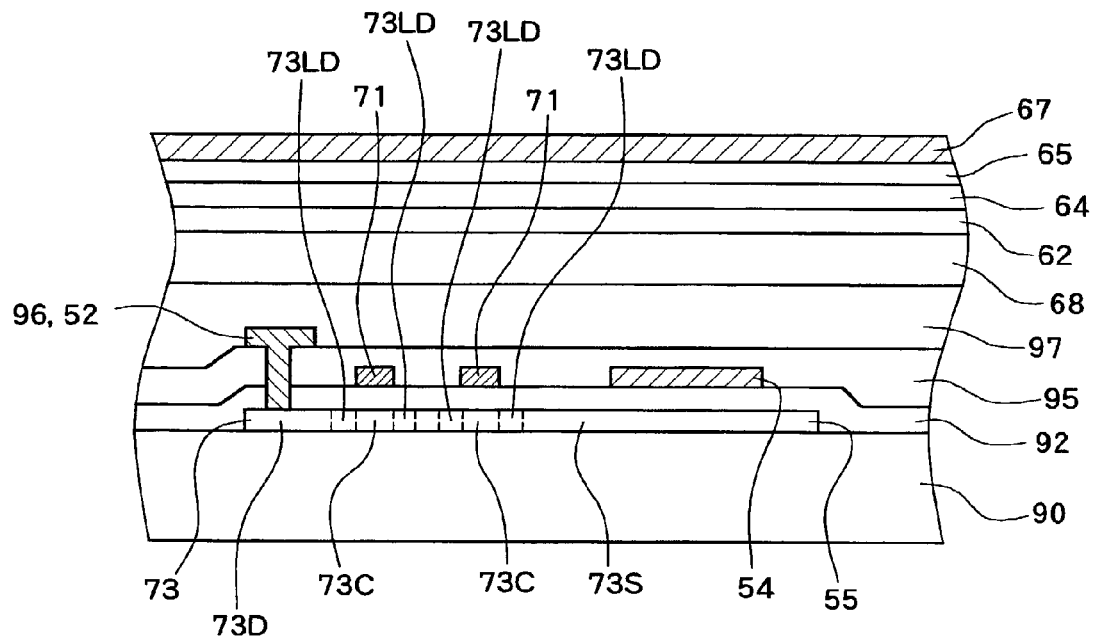
FIGS. 8A and 8B are schematic cross sectional diagrams respectively along the D—D line and along the E—E line in FIG. 7 showing a structure of the organic EL display panel.
Figure 8B:
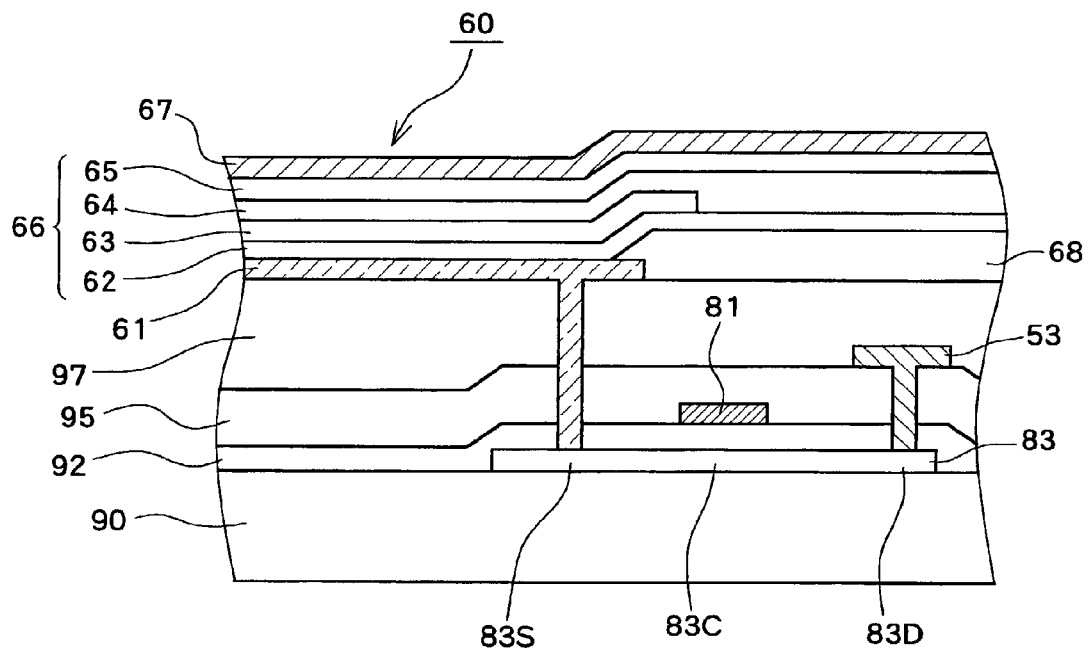

FIGS. 8A and 8B show cross sections near the pixel shown in FIG. 7. FIG. 8A shows a cross section along the line D—D in FIG. 7 and FIG. 8B shows a cross section along the line E—E in FIG. 7. As shown in FIGS. 8A and 8B, the element layer of the display substrate in the organic EL display panel is formed by sequentially layering the TFT and the organic EL element 60 on substrate 90 such as a glass substrate, a synthesized resin substrate, a conductor substrate, or a semiconductor substrate.

The formation process of the TFT 70 for controlling the charging/discharging of the capacitor electrode 55 will first be described.

As shown in FIG. 8A, on an insulative substrate 90 made of quartz glass, non-alkali glass, or the like, an active layer 73 is formed which is made of a polycrystalline silicon film obtained by polycrystallizing an amorphous silicon film through irradiation of laser. In the active layer 73, a structure commonly known as an LDD (Lightly Doped Drain) structure is created. More specifically, on both sides of the channel, low concentration regions 73LD are provided, and further a source 73S and a drain 73D which are high concentration regions are provided outside the LD region 73LD. Over the active layer 73, a gate insulative film 92 and a gate electrode 71 which constitute a portion of the gate signal line 51 made of a high melting point metal such as Cr and molybdenum (Mo) are formed. At the same time, the storage capacitor electrode 54 is also formed. Then, an interlayer insulative film 95 having a structure in which a silicon oxide film ($SiO_2$ film) and a silicon nitride film (SiN film) are layered in that order is formed over the entire surface of the gate insulative film 92. A contact hole is formed to correspond to the drain 73D and is filled with a metal such as aluminum (Al). The drain signal line 52 and a drain electrode 96 which forms a part of the drain signal line 52 are then formed. Over the film surface, a planarization insulative film 97 is provided for planarizing the surface, the film 97 being made of, for example, an organic resin.

Next, the formation process of the TFT 80 for driving the organic EL element 60 to emit light will be described. In FIG. 8B, structures formed of the same material as, and simultaneously with, the structures described above with reference to FIG. 8A are generally assigned the same reference numerals.

As shown in FIG. 8B, onthe insulative substrate 90 as described above and made of quartz glass, non-alkali glass, or the like, an active layer 83 made of the polycrystalline silicon film is formed simultaneously with the active layer 73 of the TFT 70. In the active layer 83, a channel 83C which is intrinsic or substantially intrinsic is provided below the gate electrode 81 and a source 83S and a drain 83D are provided at both sides of the channel 83C by ion doping a p-type impurity, so that a p-type channel TFT is formed. Over the active layer 83, the gate insulative film 92 and the gate electrode 81 made of a high melting point metal such as Cr and Mo are formed. The gate electrode 81 is formed simultaneously with the gate electrode 71 in FIG. 8A, and is connected to the source 73S of the TFT 70 as described above. Over the entire surface of the gate insulative film 92 and the gate electrode 81, an interlayer insulative film 95 is formed in which a $SiO_2$ film and a SiN film are layered in that order. A contact hole is formed to correspond to the drain 83D and is filled with a metal such as Al. At the same time, the driving power supply line 53 is formed. Furthermore, over the film surface, a planarization insulative film 97 is formed for planarizing the surface, the film 97 being made of, for example, an organic resin. A contact hole is formed in the planarization insulative film 97 to allow a connection to the source 83S and a transparent electrode 61 which is to be connected to the source 83S through the contact hole is formed on the planarization insulative film 97. The transparent electrode 61 constitutes the anode of the organic EL element, and allows transmission, towards the side of the substrate 90, of light emitted from the organic EL element 60 to be layered on top of the transparent electrode 61. As the transparent electrode 61, for example, an ITO (Indium Tin Oxide) which is an oxide of indium and tin is used.

The organic EL element 60 is constructed by forming and layering a light emitting element layer 66 and an Al cathode 67 in that order on top of the anode 61. The light emitting element layer 66 further has a four-layer structure, each structure formed and layered above the anode 61 in order and made of a material, for example, as described below.
(1) Hole transport layer 62: "NPB"
(2) Emissive layer 63: following materials are used corresponding to each of different emission colors
Red—A host material "$Alq_3$" doped with "DCJTB"
Green—A host material "$Alq_3$" doped with "coumarin 6"
Blue—A host material "BAlq" doped with "perylene"
(3) Electron transport layer 64: "$Alq_3$"
(4) Electron injection layer 65: lithium fluoride (LiF)

The abbreviations used above for describing the materials represent the following compounds.
"NPB"—N,N'-di(naphthalene-1-yl)-N,N'-diphenyl-benzidine
"$Alq_3$"—Tris(8-hydroxyquinolinato)aluminum
"DCJTB"
(2-(1,1-dimethylethyl)-6-(2-(2,3,6,7-tetrahydro-1,1,7,7-tetramethyl-1H,5H-benzo[ij]quinolizin-9-yl)ethenyl)-4H-pyran-4-ylidene)propanedinitrile
"Coumarin 6"—3-(2-benzothiazolyl)-7-(diethylamino)coumarin
"BAlq"—(1,1'-bisphenyl-4-olato)bis(2-methyl-8-quinolinplate-N1,08)aluminum The hole transport layer 62, electron transport layer 64, electron injection layer 65, and cathode 67 are formed to be common for each of the organic EL elements 60 corresponding to a pixel as shown in FIG. 7. An island-like emissive layer 63 is formed corresponding to the anode 61. At the periphery of the anode 61, an insulative film (planarization insulative film) 68 made of an organic resin or the like is formed (outside the region shown by dotted lines in FIG. 7). This film is provided in order to prevent shortage of the cathode 67 and anode 60 caused by cracking of the emissive layer 63 due to the step created by the thickness of anode 61.

When the pixel of the organic EL element 60 formed as described above is driven by the TFTs 70 and 80, holes injected from the anode 61 and the electrons injected from the cathode 67 are recombined within the emissive layer 63 and light is emitted.

When the above materials are used for each of the layers constituting the organic EL element 60, it is preferable to set the temperature that can be applied to the element layer 2 to 95° C. or less, in order to prevent degradation of characteristics of each layer.

By forming layers up to the cathode 67 on the substrate 90 as described above, a display substrate 3 as shown in FIG. 4 can be obtained. A sealing glass 4 is affixed to the obtained display substrate 3 through the above described method.

By affixing in this manner, in a method for manufacturing a display panel according to the first embodiment, the following advantages can be obtained.

(1) When the glass substrate 1 and the sealing glass 4 are affixed using an adhesive 5, the application pattern of the pressure for pressurizing the affixing surfaces for the glass substrate 1 and the sealing glass 4 is set as a repeated pattern of pressure changing periods and pressure retaining periods which follow the pressure changing periods. Because of this, it is possible to preferably secure the time for allowing the highly viscous adhesive 5 to deform in response to the applied pressure, which, in turn, allows for uniform gap G and uniform seal line width W at the sealing section in a shorter length of time.

(2) When applying a pressure to the affixing surfaces, it is possible to secure, in the pressure retaining period, sufficient time for the gas present in the sealing space to escape to the outside. Because of this, it is possible to prevent pressurized gas to remain within the sealed space.

(3) The sealing section having uniform gap G and uniform seal line width W obtained in this manner is highly reliable and, thus, it is possible to maintain, for a long period of time, predetermined characteristics as a display panel.

(4) Moreover, by performing the sealing process in a nitrogen gas atmosphere having low moisture content, it is possible to minimize the moisture content remaining within the sealed space.

(Second Embodiment)

Figure 9:
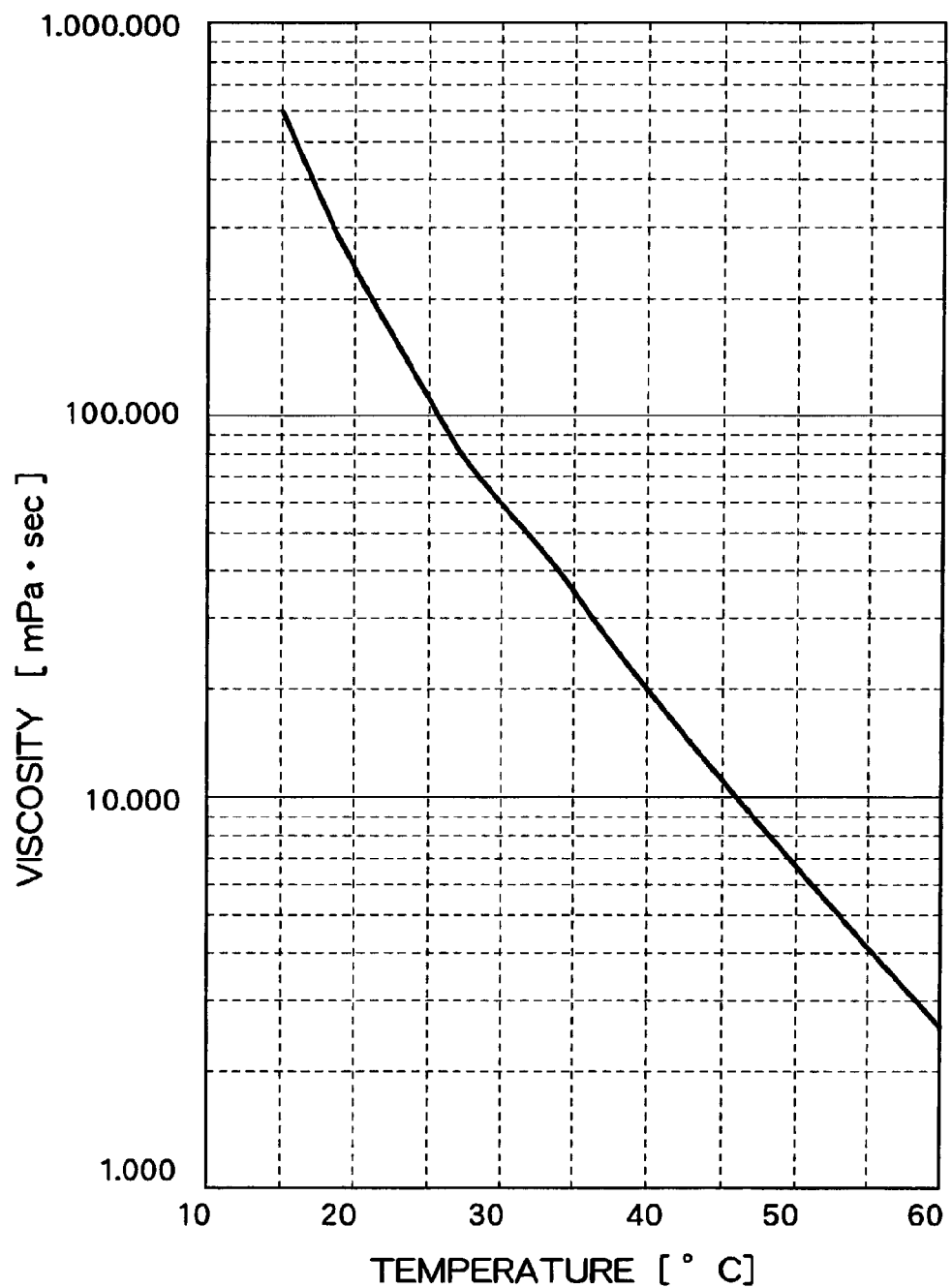
FIG. 9 is a graph showing a relationship between the temperature and the viscosity of a cation polymerizing, ultraviolet curable epoxy resin.

A method for manufacturing a display panel according to a second embodiment of the present invention will now be described referring to FIGS. 9–11. Similar as in the first embodiment, the second embodiment will be described using an example case in which the method is applied as a method for manufacturing a display panel having a display substrate constructed to include an organic EL element. In the following, the description focuses primarily on the structures differing from those of the first embodiment.

In the second embodiment, the same adhesive as described in the first embodiment, for example, a cation polymerizing, ultraviolet curable epoxy resin, is used for sealing the glass substrate (display substrate) with a sealing glass. It has been found that the viscosity of this resin is not only high, as described above, but also that the viscosity rapidly decreases as the temperature rises, as shown in FIG. 9. Normally, the standard temperature of the clean room in which the sealing process is performed is approximately 24° C. As shown in FIG. 9, the viscosity of the adhesive at this temperature is high and exceeds 100000 mPa·sec. This property of the adhesive constitutes a barrier to quick and accurate sealing of the display substrate.

Accordingly, in the second embodiment, the sealing process is performed while controlling the temperature of the nitrogen gas. If the set temperature is too high, the characteristics of the organic EL element formed on the display substrate 3 are degraded and, moreover, the viscosity of the adhesive 5 may become too low such that the adhesive may flow away from the affixing surface. Because of this, in order to seal the display substrate 3 in a desired manner, it is preferable to set the temperature within the chamber 20, that is, the temperature of the nitrogen gas, in a suitable temperature range, taking into consideration the relationship with respect to the pressure to be applied.

FIG. 10 is a diagram schematically showing an example structure of an apparatus for manufacturing a display panel according to a manufacturing method of the second embodiment.

As shown in FIG. 10, in the second embodiment, the apparatus is configured so that the temperature of the nitrogen gas to be filled into the chamber 20 can be controlled by a temperature adjusting device 26 when the sealing process of the display substrate 3 is performed. With such a configuration, it is possible to also control the temperature of the adhesive 5.

Figure 11:
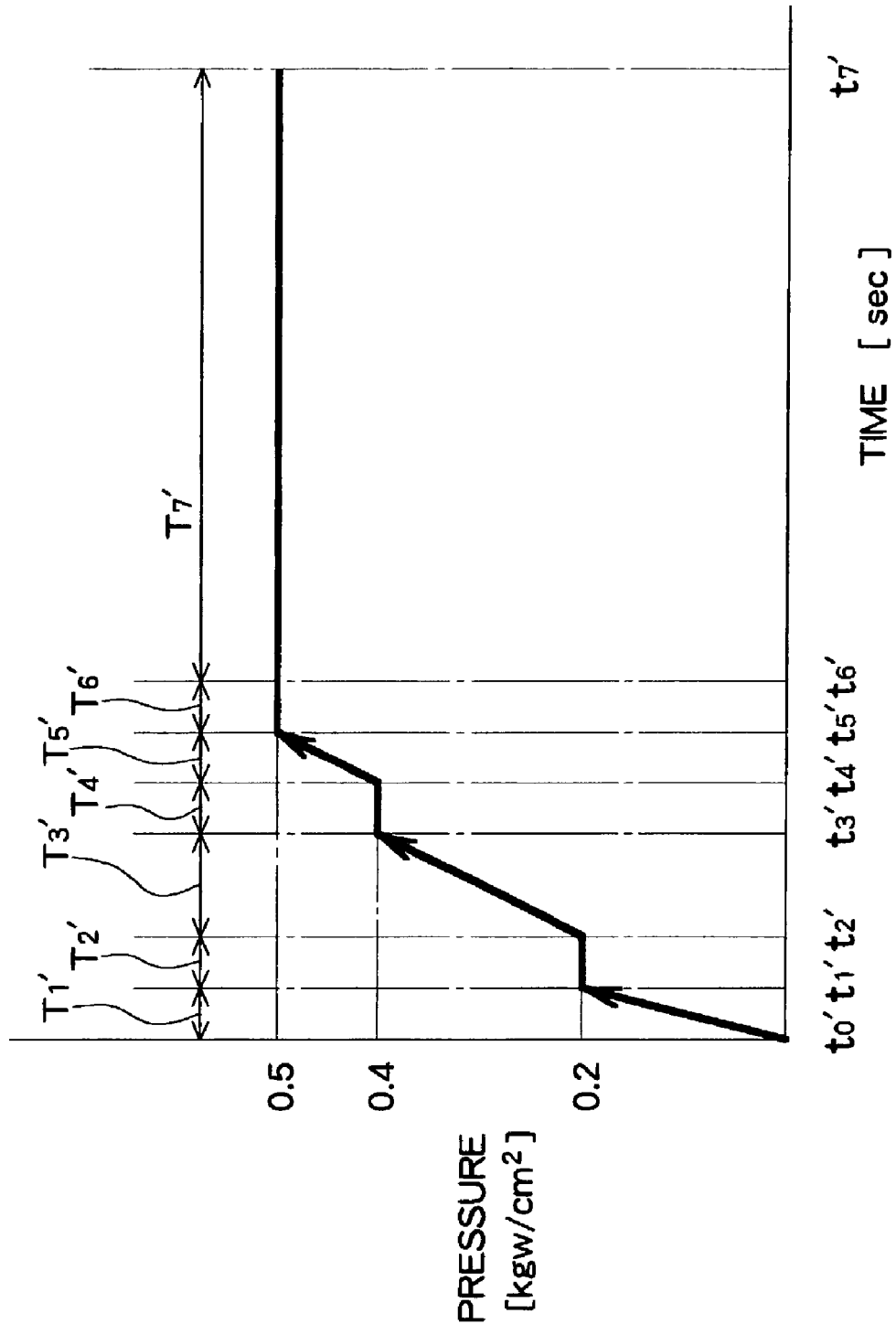
FIG. 11 is a time chart showing an example application pattern of pressure for pressing the display substrate and sealing substrate in the second embodiment of a method for manufacturing a display panel according to the present invention.

FIG. 11 shows an example pattern of application of pressure to the affixing surface when the temperature of the nitrogen gas to be filled into the chamber 20 is set at 35° C. and the glass substrate 1 is affixed to the sealing glass 4 after each component within the chamber 20, including the adhesive 5, reaches the set temperature of 35° C. This temperature for the nitrogen gas is determined based on the viscosity of the adhesive 5 suitable for pressurization onto the affixing surface.

As shown in FIG. 11, in the second embodiment, the pressure application pattern for the affixing surface has the following characteristics corresponding to the characteristics (i), (ii), and (iii) in the first embodiment.

(I) Pressure changing periods (periods $T_1'$, $T_3'$, and $T_5'$ in FIG. 10) in which the pressure is changed (increased) at a constant rate and pressure retaining periods (periods $T_2'$, $T_4'$, and $T_6'$ in FIG. 10) in which the changed (increased) pressure is retained at a constant pressure are alternately repeated so that the pressure and the gap G reach respectively their target values.

(II) Each of the pressure retaining periods $T_2'$, $T_4'$, and $T_6'$ are set to have equal length in time. In other words, the following relationship is satisfied among these periods $T_2'$, $T_4'$, and $T_6'$.

$$T_2'=T_4'=T_6'$$

(III) The amount of change (amount of increase) $\delta P5'$ of pressure during the final pressure changing period $T_5'$ is set to be smaller than either of the amounts of change (amount of increase) $\delta P1'$ and $\delta P3'$ of pressure respectively during the previous pressure changing periods $T_1'$ and $T_3'$. In other words, the following relationships are satisfied among the amounts of change of pressure, $\delta P1'$, $\delta P3'$, and $\delta P5'$. More specifically, in the example pattern shown in FIG. 11, $\delta P1'$ and $\delta P3'$ are equal to 0.2 kgw/cm$^2$ and $\delta P5'$ is equal to 0.1 kgw/cm$^2$.

$$\delta P1'>\delta P5'$$

$$\delta P3'>\delta P5'$$

In this manner, by applying a pressure to the affixing surface between the glass substrate 1 and the sealing glass 4 in a predetermined pattern, the gap G reaches its target value at least at the pressure retaining period $T_6'$ with the spacer (denoted by reference numeral 38 in FIG. 2) provided within the adhesive 5 acting as a stopper. The value of the gap G at this point is identical to that shown in the first embodiment and is approximately equal to 5 μm. At the subsequent period $T_7'$, while the application of pressure is continued, the ultraviolet light source 23 is switched on at time $t_6'$ to start ultraviolet irradiation of the affixing surface through an infrared cut filter (not shown). Similar to the irradiation of ultraviolet light as in the first embodiment, the ultraviolet light is irradiated throughout the period $T_7'$, that is, until the time $t_7'$.

Also similar as in the first embodiment, when the cross sectional shape of the adhesive 5 applied on the substrate is semicircular with a diameter of approximately 300 μm, the size of the glass substrate 1 is 300 mm×400 mm, and it is desired to obtain 9 to 96 display substrates 3 by cutting after the sealing process, the pressures applied to the affixing surface for the pressure retaining periods $T_2'$, $T_4'$, and $T_6'$ respectively are, as shown in FIG. 11, 0.2 kgw/cm$^2$, 0.4 kgw/cm$^2$, and 0.5 kgw/cm$^2$. These set values for pressure are set to be equal to those in the first embodiment in order to more reliably allow the gap G to reach the target value. The durations for each of the periods in the pressure application pattern are, from period $T_1'$ to period $T_6'$, 5 seconds, 5 seconds, 10 seconds, 5 seconds, 5 seconds, and 5 seconds. In other words, the lengths of the pressure retaining periods $T_2'$, $T_4'$, and $T_6'$ are set at a ratio of 1:1:1. Again similar to the first embodiment, in order to obtain a uniform gap G and a uniform seal line width W at the sealing section by the adhesive 5 to secure sealing quality, the present inventors have found that it is desirable to set the above values within a range of ±20% for pressure and a range of ±50% for duration. The present inventors have also found that, similar to the first embodiment, for the ultraviolet irradiation period $T_7'$, when the ultraviolet illumination is approximately 100 mW/cm$^2$, it is desirable to set the length of period $T_7'$ to 60 seconds in order to obtain satisfactory curing of the adhesive 5. These are already described in the first embodiment.

The pressure described above can also be converted into values represented in the SI unit pascals [Pa], as described in the first embodiment.

Also, in the second embodiment, it is possible to form an organic EL element layer having a structure as described in the first embodiment on the display substrate to construct an organic EL display panel.

As described, according to the method for manufacturing a display panel in the second embodiment, the following advantages can be obtained in addition to those that can be obtained through the first embodiment.

(5) Because, when a display substrate 3 of a display panel is sealed to a sealing glass 4 by an adhesive 5, the viscosity of the adhesive 5 can be suitably controlled by controlling the temperature, it is no longer necessary to set the relationship among the pressure retaining periods to $$T_2'<T_4'<T_6'$$

Therefore, it is possible to complete the sealing process of the display substrate 3 in even shorter amount of time than the first embodiment.

(6) Because the temperature to be controlled is set at 35° C., the characteristics of the organic EL element formed on the display substrate 3 are not degraded.

(Other Embodiments)

The above embodiments can be suitably modified and applied as follows.

In the examples illustrating the above embodiments, the final pressure retaining periods $T_6$ and $T_6'$ are set as a time period until the gap G between the affixing surfaces of the glass substrate 1 and the sealing glass 4 reaches a predetermined value (target value). However, the present invention is not limited to these configurations. For example, it is possible to further provide an additional sensor or the like for monitoring the gap G and allow the curing process of the adhesive 5 to start based on a feedback value of the gap G from the sensor or the like. In this manner, it is possible to immediately start curing the adhesive 5 after the gap G has reached the target value, to thereby further shorten the length of time required for sealing. Moreover, the curing process for the adhesive 5 need not be started after the gap G has reached the target value, and it is also possible to set the timing so that the gap G reaches the target value during the curing process of the adhesive.

In each of the above embodiments, an example pressure application pattern to the affixing surface between the glass substrate 1 and the sealing glass 4 has been described. The application patterns in the embodiments are not, however, limited to the example application patterns. For example, it is also possible to set the pressure retaining periods in the first embodiment to be equal or to independently set the pressure retaining periods such as in a ratio of 1:2:3 in the second embodiment. Alternatively, although the pressure changing period and the pressure retaining period are repeated for three cycles in the pressure application patterns in the above embodiments, it is also possible to set the pressure application pattern to repeat different number of cycles, for example, two or four or more. Also, the amount of change (amount of increase) of pressure for the final pressure changing period need not be less than the amount of change (amount of increase) of pressure during the preceding pressure changing periods. Also, the rate of change of the pressure need not be constant. In other words, in at least one of the pressure changing periods, the rate of change of the pressure may be actively set to be variable. Furthermore, the change in pressure for allowing the applied pressure to reach a target value need not be monotonically increasing, and, in some cases, a period in which the pressure is reduced may be present. In summary, any setting can be employed as long as uniform gap G and uniform seal line width W can be stably obtained between the glass substrate 1 and sealing glass 4 based on the application, in different stages, of pressure for pressurizing the affixing surfaces between the glass substrate 1 and sealing glass 4.

In the description of the above embodiments, a time period for allowing the adhesive 5 to follow the applied pressure to deform is provided by providing pressure retaining periods. However, the present invention is not limited to such a configuration and it is possible, for example, to set the process so that the movement of the glass substrate 1 (and supporting member 7) is stopped while the adhesive 5 is being deformed.

In the examples of the above embodiments, an ultraviolet curable resin is used as the adhesive 5 for affixing the glass substrate 1 and the sealing glass 4. However, the present invention is not limited to such a configuration, and the adhesive 5 may be a thermosetting resin or another adhesive which is cured by other means. As long as the adhesive can reliably affix the affixing surfaces and precisely seal the display substrate 3, any type of adhesive may be used.

In the above embodiments, nitrogen gas is used as the gas to fill inside the chamber 20. However, the present invention is not limited to such a configuration. As long as the gas is an inert gas that has low moisture content and does not adversely affect the display substrate 3, any gas, for example, a noble gas such as Ar, can be used in place of the nitrogen gas.

In the above embodiments, an example is shown in which a display substrate 3 onto which an organic EL element is formed is sealed. However, the present invention is not limited to such a configuration. For example, the method according to the present invention can be applied for sealing a display substrate onto which an inorganic EL element is formed as a light emitting element, a liquid crystal display substrate, or a plasma display substrate. The material of the substrate which forms the formation surface for the display element is not limited to glass as described in the above examples as a glass substrate 1, and a suitable transparent resin substrate which transmits, for example, ultraviolet or other appropriate light may be used.

In the above embodiments, a sealing glass 4 is used as the sealing member for sealing the display substrate 3. However, the present invention is not limited to such a configuration. For example, the display substrate 3 may be sealed using a metal casing (metal can). In this case, an adhesive suitable for the sealing member can be selected.

In the above embodiments, an example structure of the element layer 2 to be formed on the display substrate 3 is described. However, the present invention is not limited to the exemplified configuration, and the element layer can be formed as any other structure.

In the example of the second embodiment, the temperature in which the sealing process is performed is set at 35° C. However, the present invention is not limited to that temperature. It is preferable that the temperature be set in a range in which the characteristics of the organic EL element formed on the display substrate 3 are not degraded and the viscosity of the adhesive 5 is at an appropriate level, for example, between 27° C. and 55° C. It is still more preferable that the temperature is set between 29° C. and 40° C. Moreover, in order to stably obtain uniform gap G and uniform seal line width W at the sealing section and to shorten the length of time to complete the sealing process, it is most preferable to set the temperature in the range between 32° C. and 38° C. When an organic EL element 60 shown in the second embodiment is to be formed using the materials described in the first embodiment, it is preferable that the sealing temperature be set at 95° C. or less in order to prevent degradation in the characteristics in each of the layers.

Figure 12:
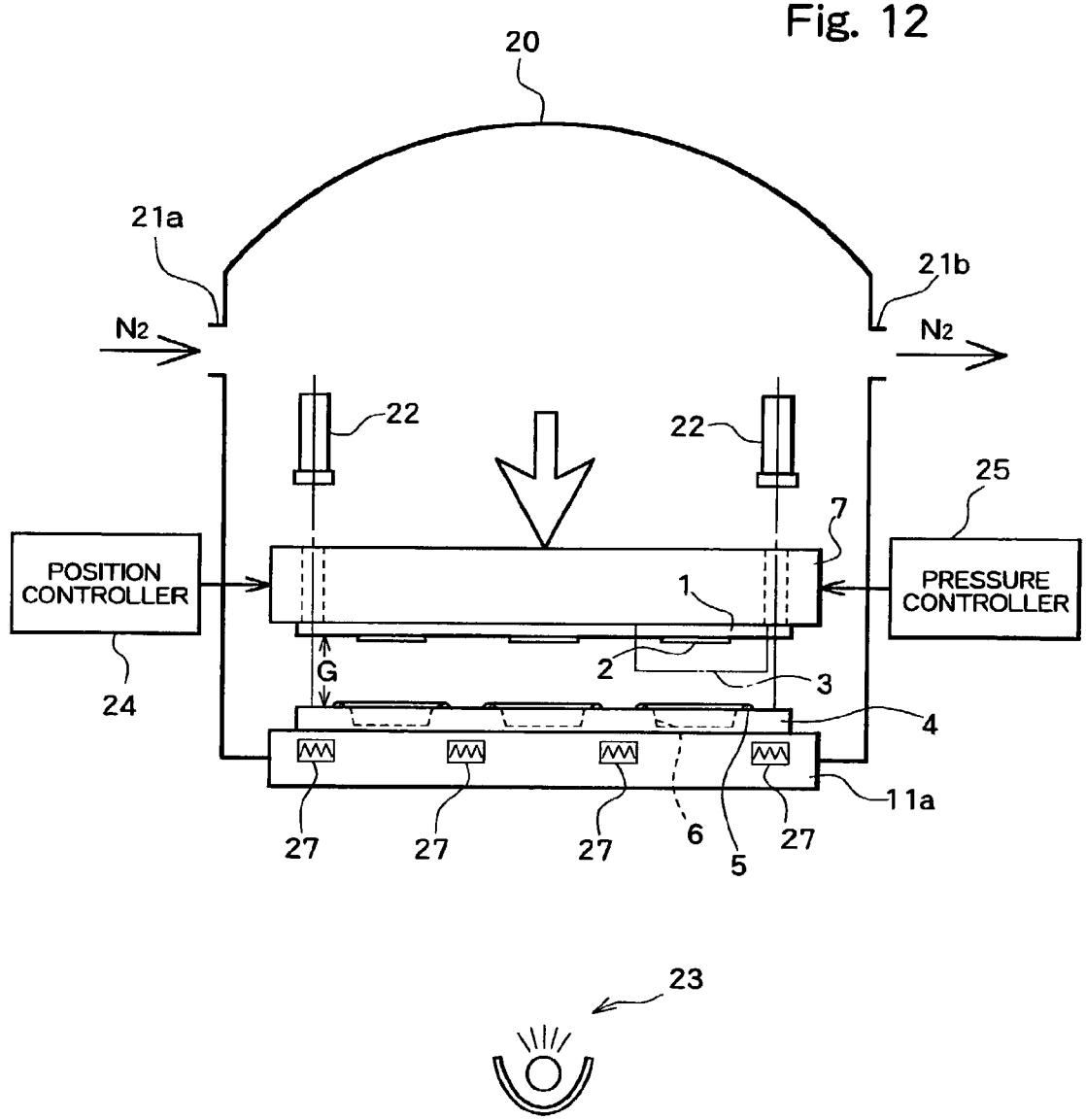
FIG. 12 is a diagram showing another example structure of a device for practicing the second embodiment of a method for manufacturing a display panel according to the present invention.
Figure 13:
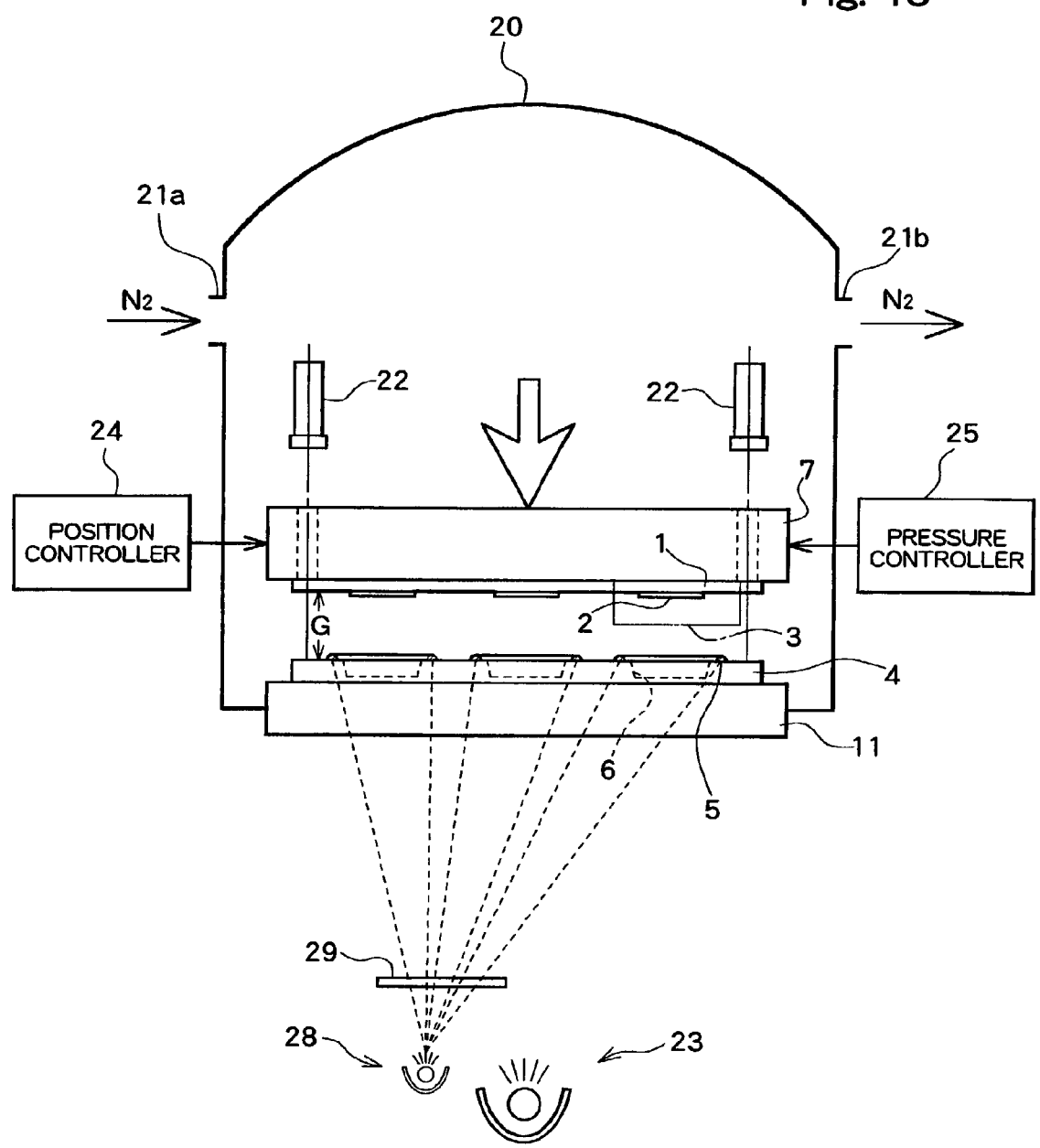
FIG. 13 is a diagram showing yet another example structure of a device for practicing the second embodiment of a method for manufacturing a display panel according to the present invention.

In the example of the second embodiment described above, the temperature control for reducing the viscosity of the adhesive 5 is performed by controlling the temperature of nitrogen gas filled into the chamber 20. However, the present invention is not limited to such a configuration. For example, as shown respectively in FIGS. 12 and 13, it is also possible to locally heat the adhesive 5 using one or more heaters or an infrared light source. In this manner, it is possible to minimize the degradation in characteristics of the organic EL element caused by the heating of the organic EL element. In the example configuration shown in FIG. 12, one or more heaters 27 are embedded within a quartz glass 11a below the sealing glass 4, at positions corresponding to the positions on the sealing glass 4 where the adhesive 5 is applied. With this configuration, it is also possible to employ other heat sources such as, for example, a heat pipe, in place of the heater 27 embedded within the quartz glass 11a. In the example shown in FIG. 13, the structure is configured so that infrared light irradiated from an infrared light source 28 is irradiated onto only the adhesive 5 through an infrared irradiation mask 29. According to these methods for manufacturing, because in both configurations, the adhesive 5 is locally heated, it is possible to shorten the length of time for manufacturing a display panel while maintaining the quality as an organic EL display device by minimizing rise in the temperature of the organic EL element.

Moreover, in the second embodiment as described above, the temperature during the sealing process is controlled to be at a constant value. However, the present invention is not limited to such a configuration. It is possible to actively vary the temperature so that the viscosity of the adhesive 5 used for the sealing process is suitable for the sealing process and to obtain advantages similar to those in the second embodiment. In this configuration, it is desirable that the temperature be controlled within the range in which the display element such as the EL element is not adversely affected.

What is claimed is:

1. A method for manufacturing a display panel, comprising:
    providing an adhesive at positions to surround a formation region of a display element;
    placing a sealing substrate to oppose an element substrate at a side onto which said display element is formed;
    affixing said element substrate and said sealing substrate to each other;
    pressing said element substrate and said sealing substrate together in a pressing period, said pressing period comprising a pressure changing period and a pressure retaining period; and
    curing said adhesive,
    wherein said element substrate and said sealing substrate are pressed with said adhesive in an uncured state therebetween after said element substrate and said sealing substrate are affixed;
    wherein during said pressure changing period, pressure for pressing said substrates is continuously increased, and
    wherein during said pressure retaining period, which follows said pressure changing period, a constant pressure which is higher than a pressure at a start of said pressure changing period immediately before said pressure retaining period is retained for pressing said element substrate and said sealing substrate.

2. A method for manufacturing a display panel according to claim 1, wherein
    said pressure is changed in stages.

3. A method for manufacturing a display panel according to claim 1, wherein
    said pressure is increased in stages.

4. A method for manufacturing a display panel according to claim 1, wherein
    said pressure is changed until a gap between said element substrate and said sealing substrate to be affixed with said adhesive in between reaches a target value.

5. A method for manufacturing a display panel according to claim 1, wherein
    said constant pressure retained in said pressure retaining period is a final pressure of a pressure changing period immediately before said pressure retaining period.

6. A method for manufacturing a display panel according to claim 1, further comprising:
    a plurality of said pressure changing period and a plurality of said pressure retaining period, wherein each of said pluralities are repeated; and
    a duration of each of said plurality of pressure retaining periods is independently set to an arbitrary length.

7. A method for manufacturing a display panel according to claim 1, further comprising
    a plurality of said pressure changing period and a plurality of said pressure retaining period, wherein each of said pluralities are repeated; and
    an amount of change in pressure for each of said plurality of pressure changing periods is independently set to an arbitrary value.

8. A method for manufacturing a display panel according to claim 7, wherein
    said amount of change in pressure for a later pressure changing period among said plurality of pressure changing periods is smaller than said amount of change in pressure for an earlier pressure changing period.

9. A method for manufacturing a display panel according to claim 7, wherein
    a rate of change of pressure in at least one of said plurality of pressure changing periods differs from a rate of change of pressure in said other periods.

10. A method for manufacturing a display panel according to claim 1, wherein
    said pressure is changed over time through 3 repetitions of pressure changing periods in which pressure is changed and pressure retaining periods in which a constant pressure is retained.

11. A method for manufacturing a display panel according to claim 1, wherein
    said adhesive is an ultraviolet curable resin;
    said ultraviolet curable resin is a cation polymerization type epoxy resin.

12. A method for manufacturing a display panel according to claim 1, wherein
    a temperature of said adhesive is controlled during when said element substrate and said sealing substrate are affixed with said adhesive therebetween.

13. A method for manufacturing a display panel according to claim 12, wherein
    prior to pressing said element substrate and said sealing substrate to be affixed, said temperature of said adhesive is raised to a predetermined temperature.

14. A method for manufacturing a display panel according to claim 12, wherein
    said element substrate and said sealing substrate are pressed with a pressure which changes over time while said temperature of said adhesive is being raised to a predetermined temperature.

15. A method for manufacturing a display panel according to claim 12, wherein
said temperature of said adhesive to be controlled is a temperature that does not affect characteristic degradations of said display element.

16. A method for manufacturing a display panel according to claim 15, wherein
said display element is an electroluminescence display element.

17. A method for manufacturing a display panel according to claim 16, wherein
said electroluminescence display element is an organic electroluminescence element containing an organic compound in at least an emissive layer.

18. A method for manufacturing a display panel according to claim 12, wherein
said temperature of said adhesive is controlled based on said pressure for pressing said element substrate and said sealing substrate after said affixing.

19. A method for manufacturing a display panel according to claim 17, wherein
said temperature of said adhesive to be controlled is a temperature that does not affect characteristic degradations of said display element.

20. A method for manufacturing a display panel according to claim 1, wherein
said pressure changing period and said pressure retaining period are alternately repeated for at least two times during said pressing period; and
a duration of a later one of a plurality of said pressure retaining periods is longer than that of an earlier one of said plurality of said pressure retaining periods.

21. A method for manufacturing a diaplay panel according to claim 20, wherein
said constant pressure retained in each of said pressure retaining periods is a final pressure of a pressure changing period immediately before said pressure retaining period.

22. A method for manufacturing a display panel according to claim 1, wherein
said pressure changing period and said pressure retaining period are alternately repeated for at least two times during said pressing period; and
durations of a plurality of said pressure retaining periods are equal to each other.

23. A method for manufacturing a display panel according to claim 22, wherein
said constant pressure retained in each of said pressure retaining periods is a final pressure of a pressure changing period immediately before said pressure retaining period.

24. A method for manufacturing a diaplay panel according to claim 1, wherein
said pressure changing period and said pressure retaining period are alternately repeated at least twice during said pressing period; and
of two consecutive periods, at least an initial pressure of a later period is greater than or equal to a final pressure of an earlier period.

25. A method for manufacturing a display panel according to claim 24, wherein
among said repeated pressure retaining periods, a duration of a later period is longer than that of an earlier period.

26. A method for manufacturing a display panel according to claim 24, wherein
among said repeated pressure retaining periods, a duration of an earlier period and a duration of a later period we equal to each other.

27. A method for manufacturing a display panel according to claim 1, wherein
a curing process of said adhesive is performed under a maximum pressure during said pressing period.

28. A method for manufacturing a display panel according to claim 1, wherein
a target pressure for pressing said substrates is continuously increased during said pressure changing period.

29. A method for manufacturing a display panel, comprising:
providing an adhesive at positions to surround a formation region of a display element;
placing a sealing substrate to oppose an element substrate at a side onto which said display element is formed:
affixing said element substrate and said sealing substrate to each other;
pressing said element substrate and said sealing substrate together in a pressing period, said pressing period comprising a pressure changing period and a pressure retaining period; and
curing said adhesive,
wherein said adhesive is an ultraviolet curable resin,
wherein said element substrate and said sealing substrate are pressed with said adhesive in an uncured state therebetween after said element substrate and said sealing substrate are affixed, and
wherein during said pressure changing period, pressure for pressing said substrates is continuously increased, and
wherein during said pressure retaining period, which follows said pressure changing period, a constant pressure which is higher than a pressure at a start of said pressure changing period immediately before said pressure retaining period is retained for pressing said element substrate and said sealing substrate.

30. A method for manufacturing a display panel according to claim 29, wherein
a curing process of said adhesive is performed by irradiation of ultraviolet light under a maximum pressure said pressing period.

31. A method for manufacturing a display panel according to claim 29, wherein
said pressure changing period and said pressure retaining period are alternately repeated at least twice during said pressing period; and
of two consecutive periods, at least an initial pressure of a later period is equal to or greater than a final pressure of a earlier period.

32. A method for manufacturing a display panel according to claim 31, wherein
among said repeated pressure retaining periods, a duration of a later period is longer than that of an earlier period.

33. A method for manufacturing a display panel according to claim 31, wherein
among said repeated pressure retaining periods, a duration of an earlier period and a duration of a later period are equal to each other.

34. A method for manufacturing a display panel according to claim 1, wherein
a target pressure for pressing said substrates is continuously increased during said pressure changing period.

* * * * *